(12) United States Patent
Takeuchi et al.

(10) Patent No.: US 8,188,643 B2
(45) Date of Patent: May 29, 2012

(54) DISPLAY APPARATUS

(75) Inventors: Takayuki Takeuchi, Osaka (JP); Norishige Nanai, Osaka (JP)

(73) Assignee: Panasonic Corporation, Osaka (JP)

( * ) Notice: Subject to any disclaimer, the term of this patent is extended or adjusted under 35 U.S.C. 154(b) by 623 days.

(21) Appl. No.: 10/583,071

(22) PCT Filed: Nov. 18, 2004

(86) PCT No.: PCT/JP2004/017146
§ 371 (c)(1),
(2), (4) Date: Jun. 15, 2006

(87) PCT Pub. No.: WO2005/066920
PCT Pub. Date: Jul. 21, 2005

(65) Prior Publication Data
US 2007/0138933 A1     Jun. 21, 2007

(30) Foreign Application Priority Data
Dec. 26, 2003  (JP) ................................. 2003-434839

(51) Int. Cl.
*H01J 63/04* (2006.01)
(52) U.S. Cl. ............. 313/303; 313/504; 257/40; 257/59
(58) Field of Classification Search .......... 313/495–512; 257/40, 59, 77, 99
See application file for complete search history.

(56) References Cited

U.S. PATENT DOCUMENTS

| | | |
|---|---|---|
| 5,397,721 A | 3/1995 | Hur |
| 5,771,562 A | 6/1998 | Harvey, III et al. |
| 6,150,668 A * | 11/2000 | Bao et al. ........................ 257/40 |
| 2002/0057565 A1 | 5/2002 | Seo |
| 2002/0139981 A1 * | 10/2002 | Young .............................. 257/72 |
| 2002/0158262 A1 | 10/2002 | Tsuchida |
| 2003/0164497 A1 * | 9/2003 | Carcia et al. ..................... 257/40 |
| 2003/0213952 A1 * | 11/2003 | Iechi et al. ........................ 257/40 |
| 2004/0004215 A1 * | 1/2004 | Iechi et al. ........................ 257/40 |
| 2004/0065877 A1 | 4/2004 | Hayashi et al. |

FOREIGN PATENT DOCUMENTS

| | | |
|---|---|---|
| EP | 0 866 644 | 9/1998 |
| JP | 2-2833 U | 1/1990 |
| JP | 7-74360 | 3/1995 |
| JP | 07297406 A * | 11/1995 |
| JP | 8-306955 | 11/1996 |
| JP | 10-321369 | 12/1998 |
| JP | 2002-216951 | 8/2002 |
| JP | 2002-237390 | 8/2002 |
| JP | 2002-299049 | 10/2002 |
| JP | 2002-543563 | 12/2002 |
| JP | 2003-51386 | 2/2003 |

(Continued)

*Primary Examiner* — Karabi Guharay
*Assistant Examiner* — Elmito Breval
(74) *Attorney, Agent, or Firm* — Hamre, Schumann, Mueller & Larson, P.C.

(57) ABSTRACT

In a display apparatus according to the present invention, a pixel is driven by using a thin film transistor (10) including an organic material in at least an active layer. The thin film transistor unit (10) and a display element unit (20) are laminated on a substrate (11) in this order, and a pixel electrode (15) formed on a substrate (10) side of the display element unit (20) also functions as a drain electrode of the thin film transistor (10). Therefore, when an organic material is used for a transistor for driving a display apparatus, there is provided a display apparatus that can provide effective protection without increasing the number of constituent members.

7 Claims, 4 Drawing Sheets

| FOREIGN PATENT DOCUMENTS | | |
|---|---|---|
| JP | 2003084686 A * | 3/2003 |
| JP | 2003-101031 | 4/2003 |
| JP | 2003-115456 | 4/2003 |
| JP | 2003-316292 * | 11/2003 |
| WO | 00/65670 | 11/2000 |

* cited by examiner

DISPLAY APPARATUS

TECHNICAL FIELD

The present invention relates to a display apparatus in which pixels are driven by using a thin film transistor including an organic material in an active layer.

BACKGROUND ART

At present, a thin film transistor (hereinafter, referred to as a TFT) is used favorably as a drive element in an active matrix liquid crystal display and the like. The TFT, which may have various proposed configurations, basically is configured such that a current flowing between a source electrode and a drain electrode provided in contact with a semiconductor layer is controlled by a voltage (i.e., an electric field generated by the applied voltage) applied to a gate electrode provided on the semiconductor layer via an insulating layer. Currently, the semiconductor layer constituting the TFT practically is made of a semiconductor material such as amorphous silicon and low-temperature polysilicon, which are relatively inexpensive though inferior to crystalline silicon in properties. Further, the insulating layer on which the gate electrode is provided is practically made of an insulating material such as oxide silicon and silicon nitride. However, the manufacturing process of the TFT using such a semiconductor material and an insulating material requires a large-scale device for a plasma CVD method or the like and a thin film control device for precision machining, resulting in a high manufacturing cost for the TFT. Moreover, this manufacturing process generally involves a process at temperatures higher than 350° C. Thus, there is a limit on a substrate material and the like that can be used.

In recent years, an organic semiconductor made of an organic compound as a semiconductor material that can be used for the TFT has attracted attention. As compared with the above-mentioned inorganic semiconductor of amorphous silicon, low-temperature polysilicon, or the like, the organic semiconductor allows the formation of the semiconductor layer by a low-cost and low-temperature manufacturing process such as spin coating, ink jet printing, and dip coating. Consequently, the manufacturing cost for the TFT can be reduced, and the limit on a substrate material and the like that can be used is removed. Further, due to its applicability to the low-cost and low-temperature process as mentioned above, the TFT can be formed on a flexible substrate or a large-area substrate, and accordingly it is expected to be used in a widening range of applications, for example, to a large-screen display, a sheet-like or paper-like display, and the like. However, an organic material constituting the organic TFT is likely to be deteriorated due to gas and moisture in the atmosphere. Thus, in order to use an organic material in an electronic device, it is necessary to seal the organic TFT portion by an appropriate method.

An organic electroluminescence element (hereinafter, referred to as an organic EL element) is a typical example of the electronic device using an organic material. The organic EL element also has the same problem as that of the organic TFT due to its use of an organic material. Accordingly, the life of the element is greatly dependent on a sealing technique. To solve this problem of the organic EL element, an organic EL element unit formed on a substrate has been sealed with a metal cap (Patent Document 1), or a desiccant has been provided in a vessel thereof (Patent Document 2). Further, a method is disclosed in which an organic EL element layer is sealed from both upper and lower sides with a polymer film including a barrier layer with low permeability to oxygen and water vapor (see Patent Document 3, for example). Further, a method is disclosed in which a transparent conductive film formed of a metal oxide deficient in oxygen as compared with a stoichiometric composition is formed on a surface of an organic EL element, so that moisture and oxygen are absorbed (see Patent Document 3, for example).

Although the conventional examples disclosed in Patent Documents 3, 4, and the like are intended to extend the life of the organic EL element, it is also necessary in a display apparatus (in which the organic EL is not necessarily used for a display unit) using the organic TFT as a drive element to prevent the entry of gas and moisture in the atmosphere in a like manner. However, the methods of using a metal cap as disclosed in Patent Documents 1 and 2 and the method disclosed in Patent Document 3 require an additional sealing member. As a result, the manufacturing process is increased, and a display apparatus is increased in thickness. In the method disclosed in Patent Document 4, although the organic EL element as a display element unit is protected, when the organic TFT is used, it is impossible to prevent gas and moisture in the atmosphere from entering the organic TFT unit.

As described above, to meet the demand for a sheet-like and large-screen display and an extended life, it is necessary to provide a method for protecting the organic material unit without increasing the number of constituent members.

Patent Document 1: JP 8(1996)-306955 A
Patent Document 2: JP 2002-216951 A
Patent Document 3: JP 2002-543563 A
Patent Document 4: JP 2002-237390 A

DISCLOSURE OF INVENTION

The present invention was made to solve the above-mentioned conventional problems and provides a display apparatus that can provide effective protection without increasing the number of constituent members when using an organic material for a transistor for driving the display apparatus.

In the display apparatus according to the present invention, a pixel is driven by using a thin film transistor including an organic material in at least an active layer. The thin film transistor unit and a display element unit are laminated on a substrate in this order, and a pixel electrode formed on a substrate side of the display element unit also functions as a drain electrode of the thin film transistor.

BRIEF DESCRIPTION OF DRAWINGS

[FIG. 1]

[FIG. 2]

[FIG. 3]

[FIG. 4]

DESCRIPTION OF THE INVENTION

According to the present invention, the thin film transistor unit and a display element unit are laminated on a substrate in this order, and a pixel electrode formed on a substrate side of the display element unit also functions as a drain electrode of the thin film transistor. Therefore, it is possible to provide a display apparatus that can provide effective protection without increasing the number of constituent members.

It is preferable that a source electrode of the thin film transistor is formed so as to be opposed to the pixel electrode in a thickness direction with the active layer interposed therebetween. Consequently, an entire top surface of a channel region of the active layer can be protected by the pixel electrode that also functions as a drain electrode.

It is preferable that the source electrode has an area not less than 25% the size of the pixel electrode. Consequently, the area of the source electrode per pixel becomes sufficiently large. Thus, when an arbitrary necessary current value is set for each pixel, the current density when the TFT is operated is decreased, and accordingly the life of the organic TFT unit can be extended further.

It is preferable that a conductive film for suppressing gas permeation of gas and moisture is formed outside of the display element unit. Consequently, it is possible to shield the display element unit from gas and moisture in the air also on its surface, resulting in an extended life.

The suppression of gas permeation of oxygen, moisture, and the like as mentioned above can be determined by a gas transmission test at room temperature. In the gas transmission test at room temperature, an oxygen transmission rate (OTR) can be measured by using a commercially available device (e.g., Oxtran 10/50 manufactured by Mocon, etc.) at room temperature (23° C.) in a dry environment.

More specifically, the gas transmission rate is preferably less than 10 ml/m$^2$/day/MPa.

It is preferable that the conductive film is formed so as to cover an entire surface of a display region. Consequently, as compared with a configuration in which the conductive film on the surface of the display element unit is delimited for each pixel, the entry of gas and moisture from the surface can be suppressed effectively.

It is preferable that the substrate suppresses gas permeation of oxygen and moisture. Consequently, it is possible to prevent the entry of gas and moisture from the substrate side, resulting in an extended life.

Further, in the above-described display apparatus, it is preferable that the substrate is flexible. With this configuration, it is possible to achieve a long-life and flexible display apparatus or a pliable and light-weight display apparatus with high impact resistance.

Further, in the above-described display apparatus, it is preferable that the display element unit is an organic electroluminescence element. With this configuration, it is possible to achieve a long-life, self-luminous, light-weight, and low-profile display apparatus that is driven at a low DC voltage.

Further, it is preferable that the active layer unit of the thin film transistor includes an organic semiconductor layer. Consequently, it is possible to provide a flexible transistor with high impact resistance with a low-cost process.

Hereinafter, embodiments and examples will be described with reference to the drawings.

Embodiment 1

Figure 1A:
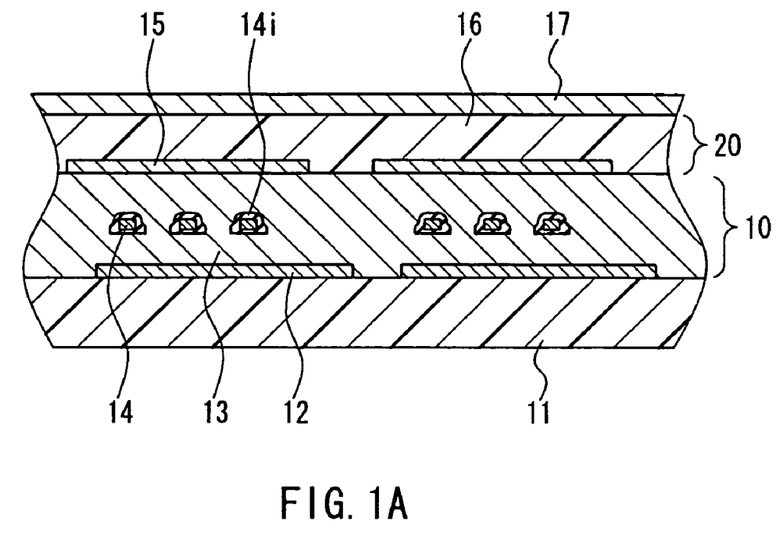
FIG. 1A is a cross-sectional view of a display apparatus according to Embodiment 1 of the present invention taken along a line I-I in FIG. 1B.
Figure 1B:
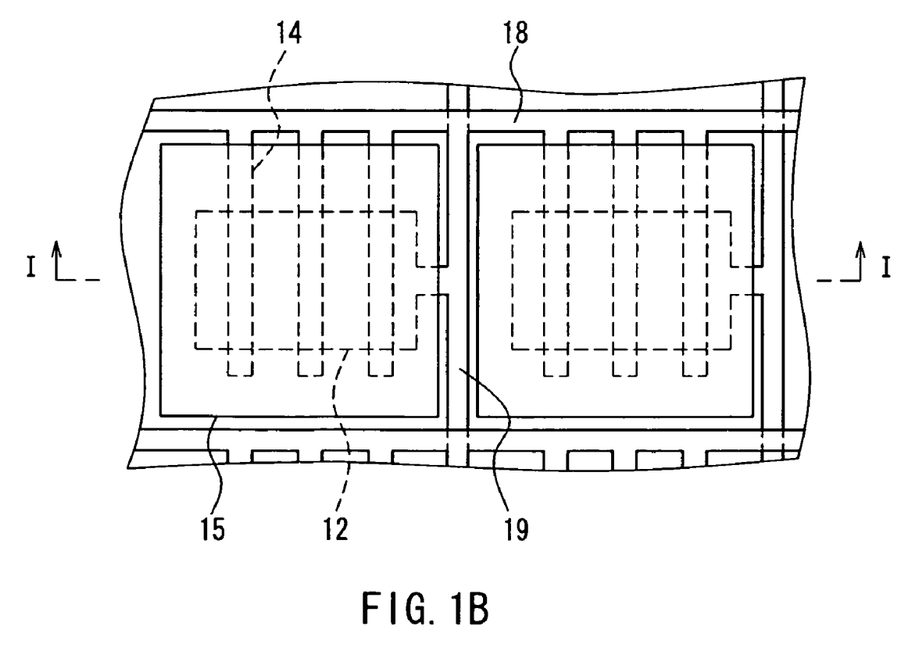
FIG. 1B is a trace of the display apparatus according to Embodiment 1 of the present invention viewed toward a substrate surface.

FIG. 1A is a cross-sectional view of a display apparatus according to Embodiment 1 taken along a line I-I in FIG. 1B. FIG. 1A shows a cross section of a region for two pixels. In FIG. 1A, a source electrode 12 is patterned on a plastic substrate 11 with low permeability to gas and moisture. Further, on the source electrode 12, an organic semiconductor layer 13 is formed. In the middle of the organic semiconductor layer 13, a lower half of a gate insulating film 14$i$ is patterned, on which a gate electrode 14 is positioned and patterned, and then an upper half of the gate insulating film 14$i$ is patterned. Then, the rest of the organic semiconductor layer 13 is laminated. Further, a pixel electrode 15 that also functions as a drain electrode is formed on the organic semiconductor layer 13. On the pixel electrode 15, an organic EL layer 16 as a display element unit and a conductive film 17 with low permeability to gas and moisture are formed so as to cover generally a display region (entire surface on which the pixels are formed). Herein, the organic EL layer 16 is formed of respective laminated layers, such as an electron transport layer, a light-emitting layer, and a hole transport layer. Reference numeral 10 denotes a thin film transistor (TFT), and 20 denotes the display element unit.

FIG. 1B is a trace of the region for the two pixels shown in FIG. 1A from the pixel electrode 15 side to the plastic substrate 11 side, showing the positional relationship of the respective components. The organic semiconductor layer 13, the insulating layer, and the like are not shown. In FIG. 1B, the gate electrode 14 and the source electrode 12 of each of the pixels are connected to a gate scanning line 18 and a source scanning line 19, respectively. At the intersection of the gate scanning line 18 and the source scanning line 19, the insulating layer is provided, which is not shown in the figure. The source electrode 12 preferably is configured to have an area not less than 25% the size of the pixel electrode 15. Further, the pixel electrode 15 is formed so as to cover an active layer unit (portion of the organic semiconductor layer 13 on the source electrode 12) entirely. Herein, the active layer unit to be covered does not include a connecting wiring portion between the source scanning line 19 and the source electrode 12 and a portion of the organic semiconductor layer 13 on the source scanning line 19.

Embodiment 2

Figure 3A:
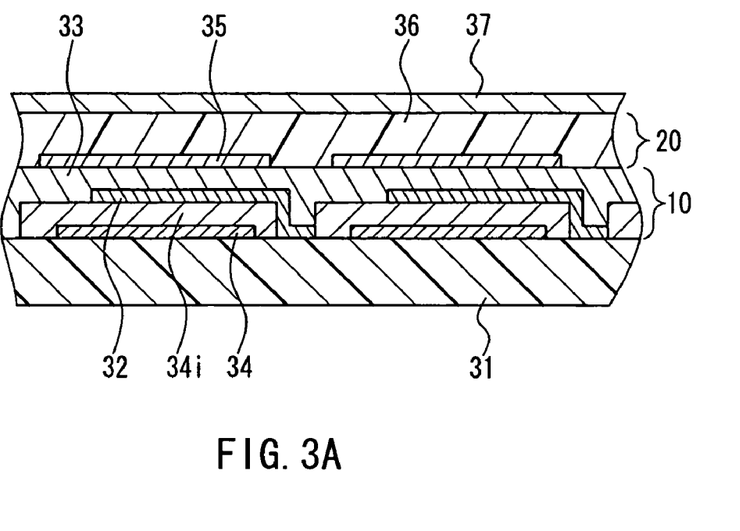
FIG. 3A is a cross-sectional view of a display apparatus according to Embodiment 2 of the present invention taken along a line II-II in FIG. 3B.
Figure 3B:
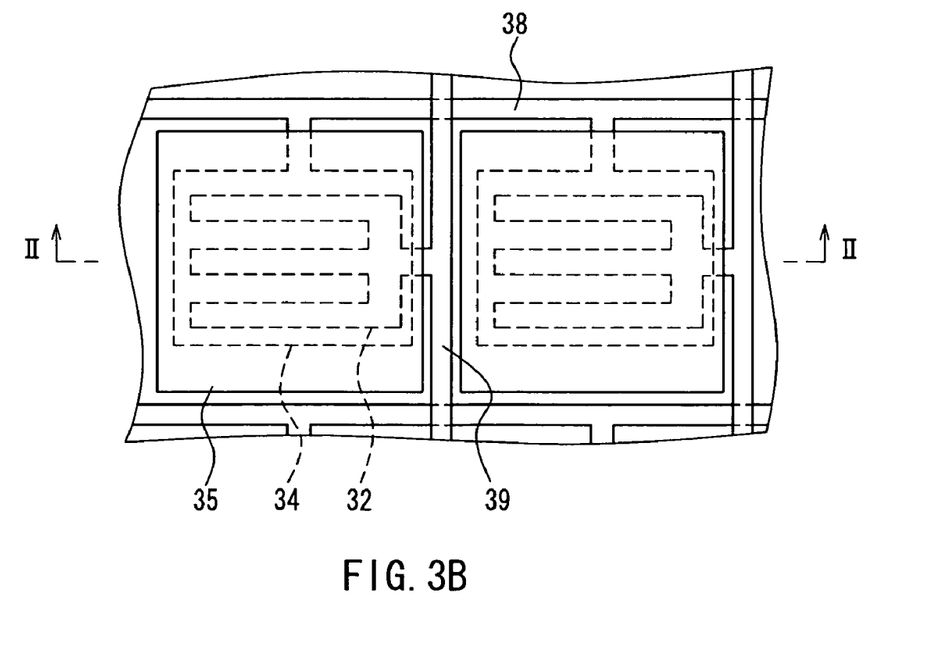
FIG. 3B is a trace of the display apparatus according to Embodiment 2 of the present invention viewed toward a substrate surface.

In Embodiment 2, another configuration of the present invention will be described with reference to FIGS. 3A and 3B. FIG. 3A is a cross-sectional view of a region for two pixels in a display apparatus according to Embodiment 2 taken along a line II-II in FIG. 3B. In FIG. 3A, a gate electrode 34 is patterned on a plastic substrate 31. Further, on the gate electrode 34, an insulating layer 34$i$ is patterned, on which a source electrode 32 is patterned thereafter. On the source electrode 32, an organic semiconductor layer 33 is formed, on which a pixel electrode 35 that also functions as a drain electrode is formed thereafter. On the pixel electrode 35, an organic EL layer 36 as a display element unit 20 and a conductive film 37 with low permeability to gas and moisture are formed so as to cover generally a display region (entire surface on which the pixels are formed). Reference numeral 10 denotes a thin film transistor (TFT). FIG. 3B is a trace of the region for the two pixels shown in FIG. 3A from the pixel electrode 35 side to the plastic substrate 31 side, showing the positional relationship of the respective components. The organic semiconductor layer 33, the insulating layer 34i, and the like are not shown. In FIG. 3B, the gate electrode 34 and the source electrode 32 of each of the pixels are connected to a gate scanning line 38 and a source scanning line 39, respectively. At the intersection of the gate scanning line 38 and the source scanning line 39, the insulating layer 34i is provided, which is not shown in the figure. Further, the pixel electrode 35 is formed so as to cover an active layer unit (portion of the organic semiconductor layer 33 on the source electrode 32) entirely.

Example 1

In the present example, the configuration described in Embodiment 1 and FIGS. 1A and 1B was used. The plastic substrate 11 in the present example was a multilayer substrate obtained by depositing an Al film with a thickness of 50 μm on a polyethylene terephthalate hereinafter, referred to as PET) film with a thickness of 50 μm, to which another PET film with a thickness of 50 μm was adhered further. This plastic substrate can suppress the permeation of gas and moisture by the Al film and is flexible. The respective electrodes of the source electrode 12 and the source scanning line 19 as well as the gate electrode 14 and the gate scanning line 18 were made of Au. The pixel electrode 15 was made of Li/Mg—Ag/Au. The organic semiconductor layer 13 was made of pentacene with a thickness of 0.5 μm. The insulating layer 14i was made of $Ta_2O_5$ with a thickness of 0.05 μm and was wrapped around the gate electrode 14 formed of Au with a thickness of 0.1 μm (total thickness of the gate unit: 0.2 μm). The organic EL layer 16 was made of triphenyldiamine derivative (TPD)/aluminum quinolinol complex ($Alq_3$) with a thickness of 0.35 μm. The conductive film 17 was made of indium-tin oxide (ITO) with a thickness of 0.3 μm to which oxygen defects were introduced by adjusting the oxygen atmosphere in forming the film and the film formation conditions so as to add a function of suppressing the permeation of gas and moisture. This achieves a gas transmission performance of less than 10 $ml/m^2/day/MPa$.

By turning ON/OFF a voltage to be applied to the gate electrode, a current flowing from the source electrode to the drain electrode (pixel electrode) is controlled. As a result, a voltage is applied between the pixel electrode and the conductive film, so that the organic EL layer emits light. The voltage applied to the gate electrode was 30 to 50 volts DC, and the voltage applied to the organic EL layer was 5 to 10 volts DC.

As the source electrode 12, several types of electrodes with different sizes including one that has an area 25% the size of the pixel electrode 15 were prepared for comparison as shown in Table 1. The results are shown in Table 1 below.

Comparative Example

Figure 4A:
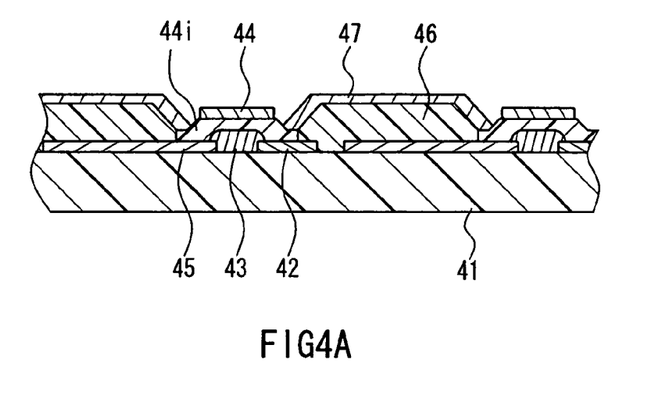
FIG. 4A is a cross-sectional view of a display apparatus according to a comparative example taken along a line III-III in FIG. 4B.
Figure 4B:
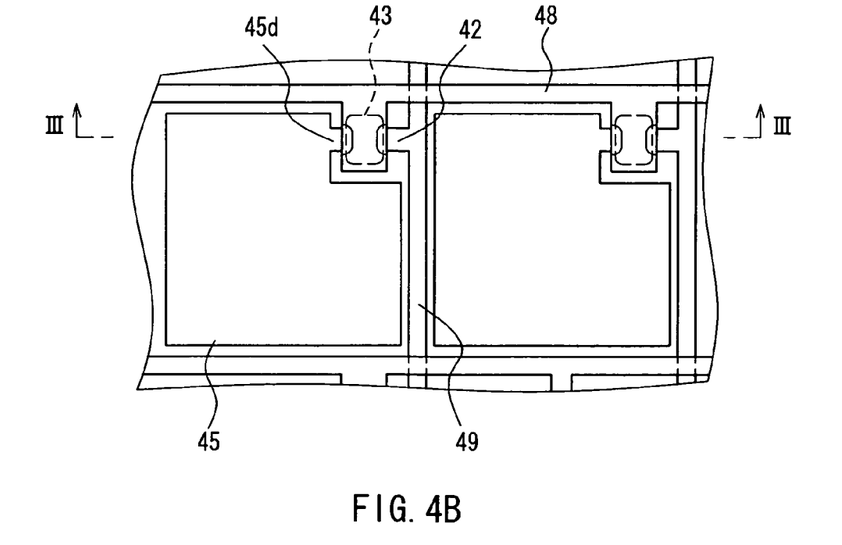
FIG. 4B is a trace of the display apparatus according to the comparative example viewed toward a substrate surface.

As a comparative example, a display apparatus as shown in FIGS. 4A and 4B was manufactured. FIG. 4A is a cross sectional view of the display apparatus according to the comparative example taken along a line III-III in FIG. 4B. FIG. 4B is a trace of a region for two pixels from a top surface side to a plastic substrate 41 side, showing the positional relationship of respective components. In FIGS. 4A and 4B, the same plastic substrate as in Example 1 was used as a substrate 41. On the plastic substrate 41, a source electrode 42 and a source scanning line 49 as well as a drain electrode 45d were patterned using Au. Further, Li/Mg—Ag/Au was patterned as a pixel electrode 45 so as to be connected with the drain electrode. Further, pentacene was patterned as an organic semiconductor layer 43, and $Ta_2O_5$ was patterned as an insulating layer 44i. Further, $TPD/Alq_3$ was patterned as an organic EL layer 46, on which ITO having the same composition as in Example 1 was patterned as a conductive film 47. Reference numeral 44 denotes a gate electrode, and 48 denotes a gate scanning line. As described above, in the display apparatus of the comparative example, the respective components are made of the same materials as in Example 1 and are different only in the structure.

As an actual display apparatus, one with a 16-by-16-pixel (256-pixel) matrix was manufactured. A TFT was driven in an atmosphere of a temperature of 60° C. and a humidity of 85% such that a constant current flowed to the organic EL element in each display apparatus. The display apparatus was considered to have come to the end of its life when defects were observed in 5% of the total pixels, i.e., 13 pixels. Table 1 shows the results of evaluating the life in the example of the present invention and the comparative example.

TABLE 1

| Ex. Com. Ex | Sample No. | Area of source electrode (%) (ratio to pixel electrode) | Life (hour) |
|---|---|---|---|
| Ex. 1 | 1 | 10 | 287 |
| | 2 | 20 | 475 |
| | 3 | 25 | 520 |
| | 4 | 30 | 535 |
| | 5 | 50 | 543 |
| Com. Ex | — | — | 87 |

Figure 2:
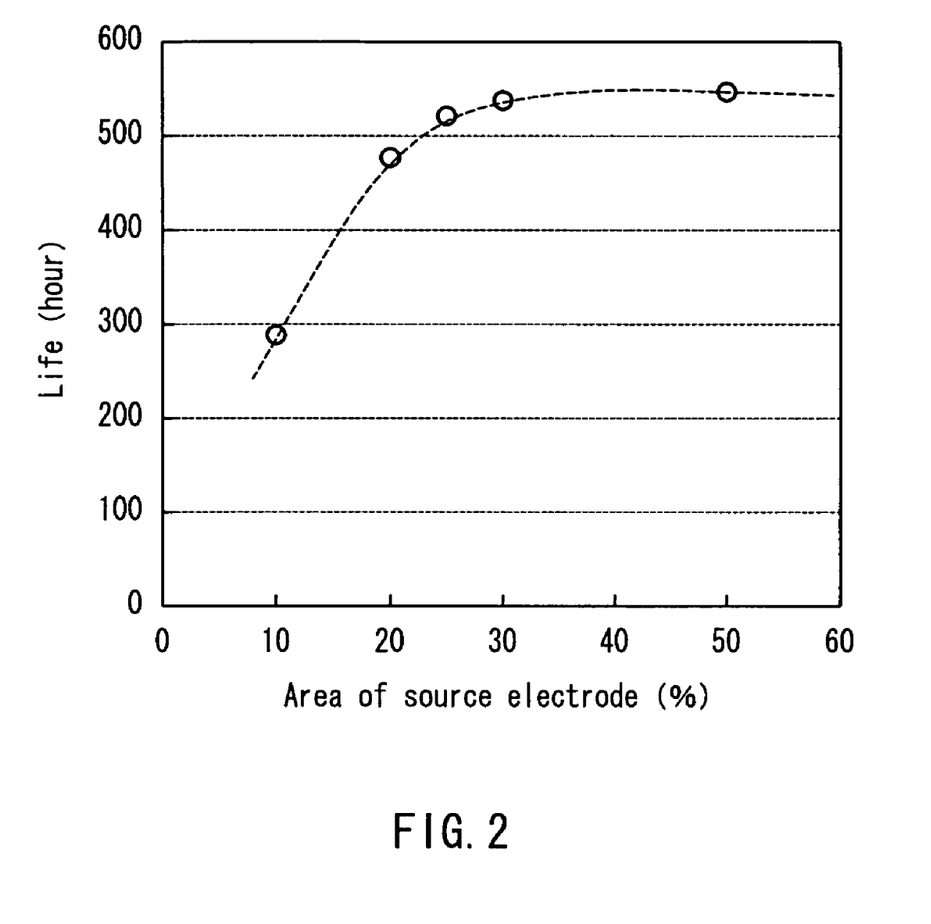
FIG. 2 is a graph showing the correlation between a source electrode and a life of a display apparatus according to Example 1 in Embodiment 1 of the present invention.

From Table 1, the life is obviously longer in Example 1 than in the comparative example. The results show that the life can be extended by the configuration as in Example 1 in which the organic TFT is sandwiched between the display element unit covered with the conductive film for suppressing the permeation of gas and moisture and the substrate, and the pixel electrode covers the top surface of the active layer entirely, as compared with the configuration as in the comparative example in which the organic TFT unit and the display element unit are provided on the substrate side by side. Further, from the graph in FIG. 2 on which the results were plotted, it was confirmed that among the samples of Example 1, those in which the source electrode had an area not less than 25% the size of the pixel electrode had a particularly increased life as compared with those in which the area of the source electrode was less than 25%.

Example 2

In the present example, the configuration described in Embodiment 2 and FIGS. 3A and 3B was used. In Example 2, respective components were made of the same materials as in Example 1. As in Example 1, as an actual display apparatus, one with a 16-by-16-pixel (256-pixel) matrix was manufactured. A TFT was driven in an atmosphere of a temperature of 60° C. and a humidity of 85% such that the same current as in Example 1 flowed to an organic EL element. The display apparatus was considered to have come to the end of its life when defects were observed in 5% of the total pixels, i.e., 13 pixels.

As a result of evaluating the life in Example 2, the display apparatus had a life of 302 hours. This shows that the life is increased sufficiently as compared with that in the comparative example shown with reference to Embodiment 1.

Further, as is evident from the comparison between the examples in the embodiments and the comparative example as described above, the effect of the present invention is derived not from the materials of the respective components, but from the configuration concerning the arrangement of the components. Therefore, the materials of the components are not limited to those shown in the present embodiments.

For example, the plastic substrate may be made of another polymer film of polyethylene naphthalate, polyimide, or the like, instead of the PET film. The barrier layer may be formed of an insulating film of a metal such as nickel, chromium, and copper, an alloy thereof, an inorganic oxide, an inorganic nitride, or the like, instead of the Al film. Further, an inorganic substrate such as a glass substrate may be used. However, the flexible plastic substrate as shown in the present embodiments is preferable to achieve a flexible display apparatus or a pliable and light-weight display apparatus with high impact resistance.

The respective electrodes of the source electrode, the drain electrode, the gate electrode, and the like are made of Au, and the pixel electrode is made of Li/Mg—Ag/Au. However, there is no Imitation to these electrode materials. Relative to the organic semiconductor layer and the display element unit, various organic or inorganic conductive materials may be selected. The conductive film on the surface is made of ITO to which oxygen defects are introduced. However, it is apparent that the same effect also can be achieved by using a usual ITO film as the conductive film when another layer having a barrier function is laminated on either side of the film. Further, a transparent conductive material other than ITO may be used as long as it has an effect of suppressing the permeation of gas and moisture.

For the same reason as above, the organic semiconductor layer and the gate insulating film may be formed of a combination of an organic semiconductor and an insulator other than the combination of pentacene and $Ta_2O_5$, such as a combination of a commonly used π-conjugated organic semiconductor and an organic insulating film of polyvinyl phenol or the like, so as to achieve the same effect.

Further, a constituent material (e.g., a protective coat, a color filter, or the like to prevent flaws) for another purpose further may be provided on the conductive film as the outermost layer of the display element unit in the configuration shown in each of the examples of the present embodiments.

In the embodiments of the present invention, the description has been given only of the case where the display element unit is formed of the organic EL element. However, the display element unit is not limited thereto. For example, the organic EL layer in each of the examples may be replaced by a liquid crystal layer. In such a case, when a color filter or the like is provided, it is arranged on the liquid crystal element, and accordingly the conductive film for suppressing the permeation of gas and moisture does not serve as an outermost layer. However, such a configuration is actually the same as that of the present invention as described above, and the same effect can be achieved. Further, in the case of using the liquid crystal element, a backlight, a polarizing plate, a reflecting plate, or the like may be required additionally. However, the addition of such a component has no influence on the effect of the present invention.

The present invention relates to a display apparatus that uses as an element for driving pixels a thin film transistor including an organic material in an active layer. However, it is clear that the same effect also can be achieved by a display apparatus in which pixels are driven by using another active element made of an organic semiconductor.

Industrial Applicability

The display apparatus according to the present invention has an effect of protecting the organic TFT unit from gas and moisture in the atmosphere and ensuring an extended life without increasing the number of members, and is applied usefully to an active matrix display and the like in which pixels are driven by using the organic TFT.

The invention claimed is:

1. A display apparatus in which a pixel is driven by using a thin film transistor unit including an organic semiconductor material, comprising:
   a substrate;
   a thin film transistor unit located above the substrate;
   a display element unit laminated on the thin film transistor unit;
   a pixel electrode formed on a substrate side of the display element unit and functioning as the pixel electrode of the display element unit and a drain electrode of the thin film transistor unit;
   a source electrode of the thin film transistor unit, which is formed so as to be opposed to the pixel electrode in a thickness direction;
   a conductive film formed outside of the display element and suppressing permeation of gas and moisture; and
   a source scanning line connected to the source electrode,
   wherein the thin film transistor unit comprises a semiconductor layer;
   the semiconductor layer includes the organic semiconductor material;
   the semiconductor layer is located between the pixel electrode and the source electrode; and
   when seen from the conductive film side, the pixel electrode has an area larger than that of the source electrode, and an edge of the source electrode except for a connecting portion between the source scanning line and the source electrode is located inside of the pixel electrode.

2. The display apparatus according to claim 1, wherein the conductive film is formed so as to cover an entire surface of a display region.

3. The display apparatus according to claim 1, wherein the substrate suppresses gas permeation of oxygen and moisture.

4. The display apparatus according to claim 1, wherein the substrate is flexible.

5. The display apparatus according to claim 1, wherein the display element unit is an organic electroluminescence element.

6. The display apparatus according to claim 1, wherein the pixel electrode covers an entire top surface of a channel region of the semiconductor layer.

7. The display apparatus according to claim 1, wherein the source electrode has an area of not less than 25% of the pixel electrode.

* * * * *

UNITED STATES PATENT AND TRADEMARK OFFICE
CERTIFICATE OF CORRECTION

PATENT NO. : 8,188,643 B2  
APPLICATION NO. : 10/583071  
DATED : May 29, 2012  
INVENTOR(S) : Takeuchi et al.

It is certified that error appears in the above-identified patent and that said Letters Patent is hereby corrected as shown below:

Title Page, Item 56, Column 2, under "Foreign Patent Documents", line 4, after "11/1995" insert --H01L 29/786--.

Title Page 2, Item 56, Column 1, under "Foreign Patent Documents, line 1, after "3/2003" insert --G09F 09/30--.

Signed and Sealed this  
Seventh Day of May, 2013

Teresa Stanek Rea  
*Acting Director of the United States Patent and Trademark Office*